(12) United States Patent
Ahn et al.

(10) Patent No.: US 9,117,699 B2
(45) Date of Patent: Aug. 25, 2015

(54) SEMICONDUCTOR MEMORY DEVICE

(71) Applicant: SK hynix Inc., Icheon-si, Gyeonggi-do (KR)

(72) Inventors: Jung Ryul Ahn, Namyangju-si (KR); Yun Kyoung Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 104 days.

(21) Appl. No.: 14/045,243

(22) Filed: Oct. 3, 2013

(65) Prior Publication Data

US 2014/0374810 A1  Dec. 25, 2014

(30) Foreign Application Priority Data

Jun. 24, 2013 (KR) .................. 10-2013-0072413

(51) Int. Cl.
*H01L 29/788* (2006.01)
*H01L 27/115* (2006.01)

(52) U.S. Cl.
CPC .... *H01L 27/11551* (2013.01); *H01L 27/11578* (2013.01)

(58) Field of Classification Search
CPC .................................................. H01L 29/7889
USPC ............................................................ 257/334
See application file for complete search history.

(56) References Cited

U.S. PATENT DOCUMENTS

2012/0156848 A1\* 6/2012 Yang et al. ............... 438/287
2014/0097484 A1\* 4/2014 Seol et al. ................ 257/324

FOREIGN PATENT DOCUMENTS

KR  1020120058222 A  6/2012
KR  1020130072671 A  2/2013

\* cited by examiner

*Primary Examiner* — Chandra Chaudhari
(74) *Attorney, Agent, or Firm* — William Park & Associates Ltd.

(57) ABSTRACT

A semiconductor memory device includes: a plurality of first channel columns including a plurality of first channel layers that are arranged in a direction and offset by their centers; a plurality of second channel columns alternately arranged with the plurality of first channel columns and having a plurality of second channel layers that are arranged in the direction and offset by their centers; first insulating layers and first conductive layers alternately stacked to surround the first channel layers; second insulating layers and second conductive layers stacked to surround the second channel layers; and spacers placed between the first channel columns and the second channel columns and interposed between the first conductive layers and the second conductive layers.

22 Claims, 12 Drawing Sheets

A-A'

A-A'

SEMICONDUCTOR MEMORY DEVICE

CROSS-REFERENCE TO RELATED APPLICATION

The present application claims priority to Korean patent application number 10-2013-0072413 filed on Jun. 24, 2013, in the Korean Intellectual Property Office, the entire disclosure of which is incorporated by reference herein.

BACKGROUND

1. Technical Field

The present invention generally relates to a semiconductor memory device. More specifically, the present invention relates to a semiconductor memory device having a three-dimensionally stacked memory cells.

2. Related Art

Nonvolatile memory devices are data storage units capable of holding their data even when power supplied thereto is suspended or shut off. Coming up to the limit to integration capacity of second-dimensional memory devices where memory cells are formed by a unitary layer on a silicon substrate, three-dimensional (3D) nonvolatile memory devices by the architecture of vertically stacking memory cells from silicon substrates are being steadily proposed.

The 3D nonvolatile memory devices usually include interlayer insulating layers and word lines, which are alternately stacked, and channel layers vertically penetrating the interlayer insulating layers and the word lines. Along the channel layers, memory cells are stacked. In manufacturing 3D nonvolatile memory devices, the stacked word lines are formed by substituting a plurality of conductive layers for a plurality of nitride layers after alternately stacking a plurality of oxide layers and the nitride layers.

However, it is quite difficult to perform the process of substituting conductive layers for nitride layers. Especially, while substituting the conductive layers for the nitride layers, there is a problem of causing the stacked structure to lean.

SUMMARY

The present invention is directed to a semiconductor memory device having a stable architecture.

Aspects of the present invention provide a semiconductor memory device including: a plurality of first channel columns including a plurality of first channel layers that are arranged in a direction and offset by their centers; a plurality of second channel columns alternately arranged with the plurality of first channel columns and having a plurality of second channel layers that are arranged in the direction and offset by their centers; first insulating layers and first conductive layers alternately stacked to surround the first channel layers; second insulating and conductive layers stacked to surround the second channel layers; and spacers placed between the first channel columns and the second channel columns and interposed between the first and second conductive layers.

In an embodiment, a semiconductor memory device includes: a plurality of channel columns including a plurality of channel layers that are arranged in a first direction and offset by their centers, wherein each of the channel layers includes a first channel layer, a second channel layer and a third channel layer connecting the first channel layer with the second channel layer; first insulating layers and first conductive layers stacked to surround the first channel layers; second insulating and conductive layers stacked to surround the second channel layers; and spacers placed between the first channel layers and the second channel layers adjacent to each other and interposed between the first conductive layers and the second conductive layers at the same level.

In an embodiment, a semiconductor memory device includes: a plurality of first channel columns including a plurality of first channel layers arranged in a direction; a plurality of second channel columns alternately arranged with the plurality of first channel columns and including a plurality of second channel layers arranged in the direction; first conductive layers stacked to surround the first channel layers; second conductive layers stacked to surround the second channel layers; insulating layers interposed between the first conductive layers and between the second conductive layers and configured to surround the first and second channel layers; and spacers placed between the first channel columns and the second channel columns and interposed between the first conductive layers and the second conductive layers.

BRIEF DESCRIPTION OF THE DRAWINGS

The above and other features and advantages of the present invention will become more apparent to those of ordinary skill in the art by describing in detail various examples of embodiments thereof with reference to the attached drawings in which:

FIGS. 4A to 8A and 4B to 8B illustrate a method of manufacturing a semiconductor memory device according to an embodiment of the present invention;

DETAILED DESCRIPTION

Figure 1A:
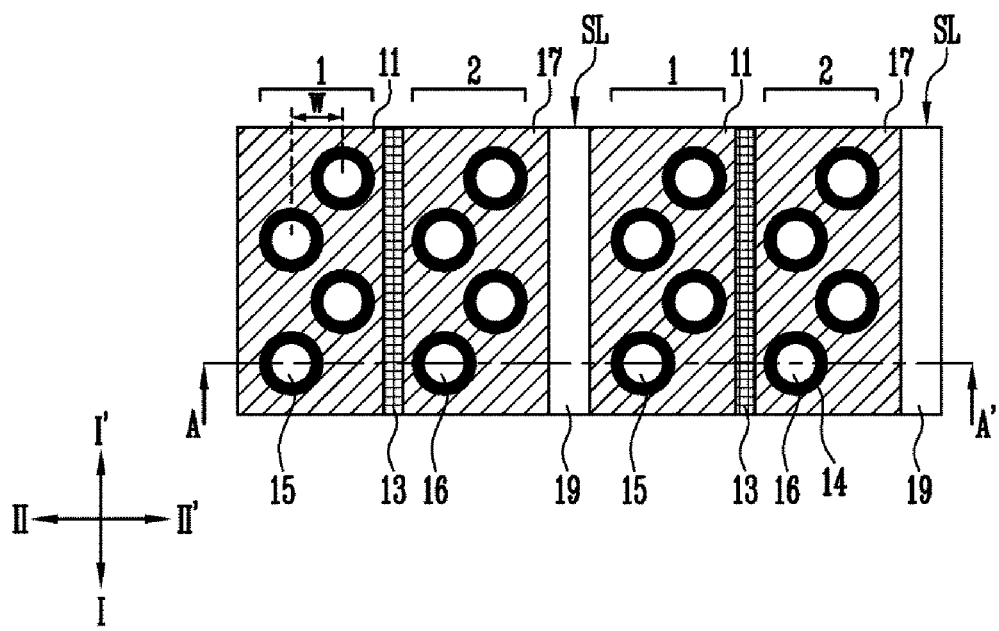
FIGS. 1A and 1B illustrate a structure of a semiconductor memory device according to an embodiment of the present invention.

The present invention will be described more fully hereinafter with reference to the accompanying drawings, in which various embodiments of the present invention are shown. This invention may, however, be embodied in different forms and should not be construed as limited to the embodiments set forth herein.

Throughout the drawings and the detailed description, unless otherwise described, the same drawing reference numerals will be understood to refer to the same elements, features, and structures. The relative size and depiction of these elements may be exaggerated for clarity, illustration, and convenience. Also, descriptions of well-known functions and constructions may be omitted for increased clarity and conciseness. In addition, terms described below are terms defined in consideration of functions in the present invention and may be changed according to the intention of a user or an operator or conventional practice. Therefore, the definitions must be based on contents throughout this disclosure.

Figure 1B:
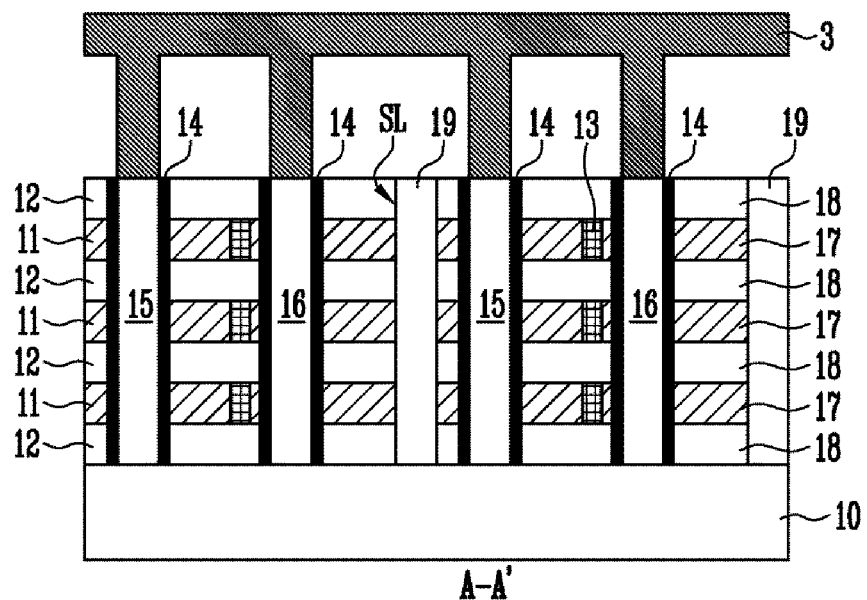

FIGS. 1A and 1B illustrate a structure of a semiconductor memory device according to an embodiment of the present invention. FIG. 1A is a plan view illustrating a section of the semiconductor memory device, and FIG. 1B is a cross-sectional view taken along line A-A' of FIG. 1A.

As shown in FIGS. 1A and 1B, the semiconductor memory device according to various embodiments of the present invention may include a plurality of first and second channel columns, 1 and 2, alternately arranged. The first channel columns 1 may include first channel layers 15 arranged in a first direction I-I'. The first channel layers 15 may be arranged to be offset by their centers in a predetermined width W. The second channel columns 2 may include second channel layers 16 arranged in the first direction I-I'. The second channel layers 16 may be arranged to be offset by their centers in the predetermined width W. For example, the first and second channel columns 1 and 2 extend in a staggering form in the first direction I-I'.

In some embodiments, the first channel layers 15 included in the first channel columns 1 may be even arranged in a straight form, fitting them on their centers. Likewise, the second channel layers 16 included in the second channel columns 2 may be arranged in a straight form, fitting them on their centers.

The first and second channel layers, 15 and 16, may have shapes with their center regions that are open or filled up with certain structures, or with some combinations thereof. If the first and second channel layers, 15 and 16, have open center regions, insulating layers (not shown) may be formed within the open center regions.

The semiconductor memory device further may include first insulating and conductive layers 12 and 11, which are alternately stacked to surround the first channel layers 15, and second insulating and conductive layers 18 and 17 alternately stacked to surround the second channel layers 16. The first and second insulating layers, 12 and 18, may contain oxide, nitride, etc., and the first and second conductive layers, 11 and 17, may contain silicon, tungsten, etc.

In this structure, among the first and second conductive layers 11 and 17, at least one at the highest level may be used as an upper selection line, at least one at the lowest level may be used as a lower selection line, and the rest may be used as word lines. In this case, strings are vertically arranged on the substrate 10, including at least one lower selection transistor, a plurality of memory cells, and at least one upper selection transistor.

The semiconductor memory device further may include memory layers 14 interposed between the first channel layers 15 and the first conductive layers 11 and between the second channel layers 16 and the second conductive layers 17. In this structure, each memory layer 14 may include at least one of a tunnel insulating layer, a data storage layer, and a charge blocking layer. For instance, the data storage layer may include a floating gate including polysilicon, etc., a charge trap layer including nitride, etc., nanodots, a phase changeable material layer, etc.

The semiconductor memory device further may include spacers 13 placed between the first and second channel columns 1 and 2 and interposed between the first and second conductive layers 11 and 17. The spacers 13 may contain oxide, nitride, titanium, etc. According to this structure, the first and second insulating layers, 12 and 18, deposited together in the same level are formed to be a single layer coupled in one. On the other hand, the first and second conductive layers, 11 and 17, deposited in the same level are formed to be isolated from each other by the spacers 13.

Additionally, since the spacers 13 are placed between the first and second channel layers 15 and 16, which are arranged to be offset, they are inclined to be closer to the first or second channel layer 15 or 16. For example, the spacer 13 between the nth first channel layer 15 and the nth second channel layer 16 is closer to the first channel layer 15, while the other spacer 13 between the n+1th first channel layer 15 and the n+1th second channel layer 16 is closer to the second channel layer 16 (n is a positive integer). According to this structure, the first conductive layer 11 becomes unbalanced over the left and right in width from the center of the first channel layer 15. Likewise, the second conductive layer 17 becomes unbalanced over the left and right in width from the center of the second channel layer 16.

The semiconductor memory device further may include slits SL placed between the first and second channel columns 1 and 2. In addition, the semiconductor memory device further may include insulating layers 19 formed in the slits SL. The slits SL are formed in a depth capable of penetrating the first and second conductive layers 11 and 17. For example, the slits SL isolate the first insulating layers 12 and the first conductive layers 11 from the second insulating layers 18 and the second conductive layers 17, respectively. The spacers 13 and the slits SL are alternately arranged between the first and second channel columns 1 and 2.

The semiconductor memory device may include a source region (not shown) formed in the substrate 10 in contact with the bottom ends of the first and second channel layers 15 and 16. For example, the source region may be defined by doping impurities into the substrate 10. Additionally, the semiconductor memory device further may include a line 3 extending in a second direction II-II'. The line 3 may be used as a bit line connected to the top ends of the first and second channel layers 15 and 16.

Figure 2A:
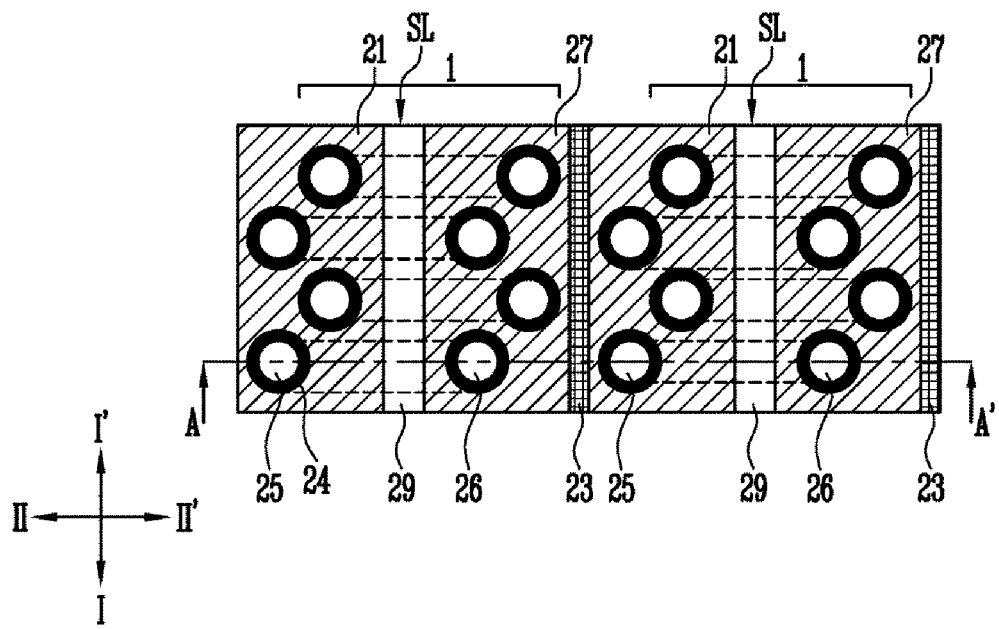
FIGS. 2A to 2C illustrate a structure of a semiconductor memory device according to an embodiment of the present invention.
Figure 2B:
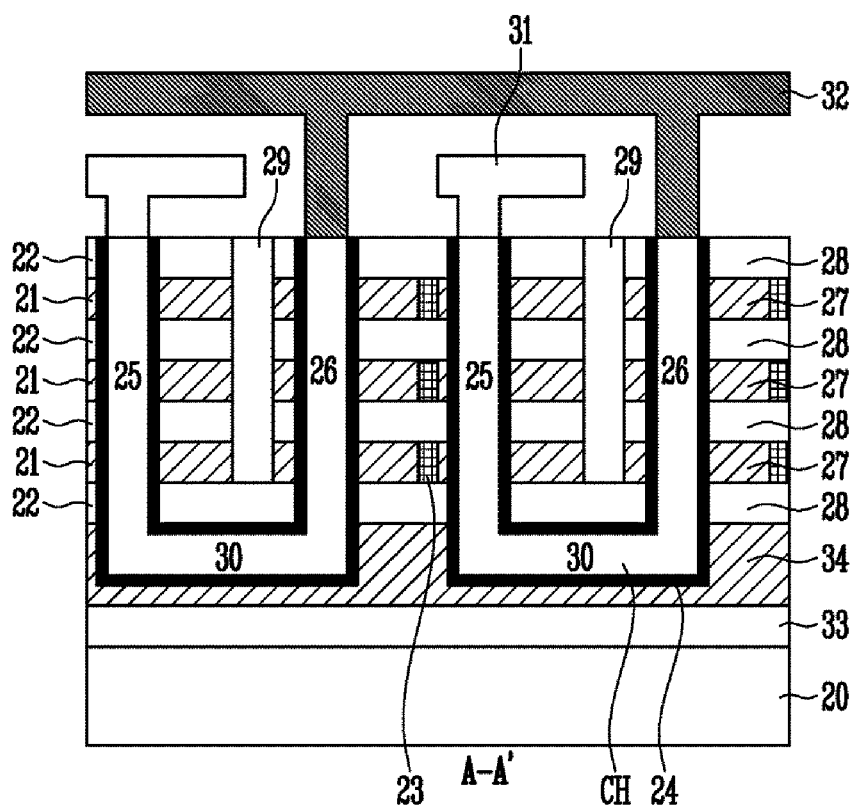
Figure 2C:
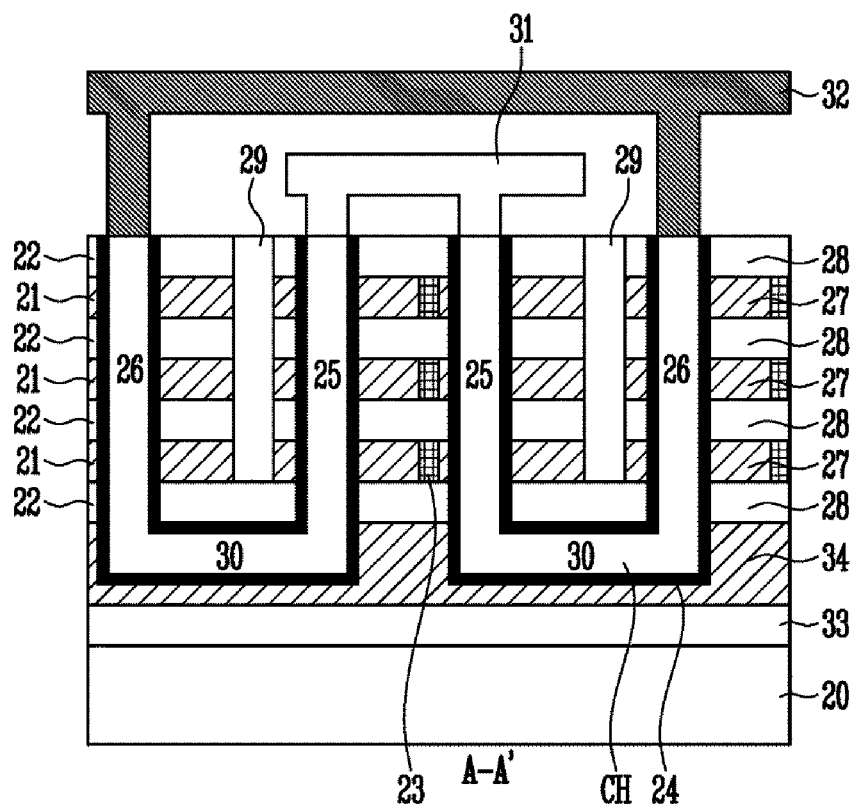

FIGS. 2A to 2C illustrate a structure of a semiconductor memory device according to an embodiment of the present invention. FIG. 2A is a top view of the semiconductor memory device, and FIGS. 2B and 2C are cross-sectional views taken along line A-A' of FIG. 2A. Hereinafter, the structure of the semiconductor memory device will be described without duplicating the aforementioned.

As shown in FIGS. 2A to 2C, the semiconductor memory device according to an embodiment of the present invention may include a plurality of channel columns 1 extending in a first direction I-I'. The channel columns 1 are each arranged in the first direction I-I', including a plurality of channel layers CH having the centers that are offset at a predetermined interval.

In this structure, each channel layer CH may include a first channel layer 25, a second channel layer 26, and a third channel layer 30 connecting the first and second channel layers 25 and 26. The channel layers CH are formed in shapes of U, W, etc. Strings ST (not shown) are arranged in the shapes of U, W, etc. Here, the first channel layers 25 may be used as source-side channel layers, while the second channel layers 26 may be used as drain-side channel layers. FIG. 2B illustrates a case in which the first channel layers 25 and the second channel layers 26 are alternately arranged in the second direction II-II'. In this case, the source/drain sides are alternately arranged (source-drain-source-drain- . . . ). FIG. 2C illustrates a case in which the channel layers CH are arranged in a manner that the first channel layers 25 are neighbored to each other and the second channel layers 26 are neighbored to each other. In this structure, the adjacent channel columns 1 are arranged in a mirror type to make the source or drain sides face each other (drain-source-source-drain- . . . ).

The semiconductor memory device further may include first insulating layers 22 and first conductive layers 21, which are alternately stacked to surround the first channel layers 25, and second insulating layers 28 and second conductive layers 27 alternately stacked to surround the second channel layers 26. In this structure, at least one of the first conductive layers 21 at the highest level may be used as a source selection line, while the rest of the first conductive layers 21 may be used as source-side word lines. At least one of the second conductive layers 27 at the highest level may be used as a drain selection line, while the rest of the second conductive layers 27 may be used as drain-side word lines. In this case, the strings ST are arranged in a shape of U on a substrate 20, each including at least one drain selection transistor, a plurality of drain-side memory cells, at least one pipe transistor, a plurality of source-side memory cells, and at least one source selection transistor.

The semiconductor memory device further may include memory layers 24 between the first channel layers 25 and the first conductive layers 21 and between the second channel layers 26 and the second conductive layers 27. In this structure, the memory layer 24 may include at least one of a tunnel insulating layer, a data storage layer, and a charge blocking layer. For example, the data storage layer may include a floating gate including polysilicon, etc., a charge trap layer including nitride, etc., nanodots, a phase changeable material layer, etc.

The semiconductor memory device further may include spacers 23 placed between the first and second channel layers 25 and 26, which are adjacent to each other in the second direction II-II', particularly between adjacent channel columns 1. Each spacer 23 is formed in a line extending in the first direction I-I', and interposed between the first conductive layers 21 and the second conductive layers 27 at the same level to insulate the first conductive layer 21 from the second conductive layer 27. According to this structure, the first and second insulating layers 22 and 28, which are deposited in the same level, are formed into a single layer coupled in a body. On the other hand, the first and second conductive layers 21 and 27, which are deposited in the same level, are formed into separate layers from each other.

As the spacers 23 are offset to locate between the first and second channel layers 25 and 26, they are inclined to be closer to either the first or second channel layer 25 or 26.

The semiconductor memory device further may include slits SL placed between the first channel layers 25 and the second channel layers 26, which are adjacent to each other in the second direction II-II', particularly between the first and second channel layers 25 and 26 that are coupled to each other through the unitary third channel layer 30. In addition, the semiconductor memory device further may include an insulating layer 29 formed in the slits SL. In this structure, the spacers 23 and the slits SL are alternately arranged between the first channel layers 25 and the second channel layers 26. According to this structure, the first conductive layers 21 and the first insulating layers 22, which are coupled to one string ST, are isolated from the second conductive layers 27 and the second insulating layers 28 through the slit SL. Additionally, through the spacers 23, the first conductive layers 21 of the adjacent strings ST in the second direction II-II' are isolated from the second conductive layers 27, and the first and second insulating layers 22 and 28 of the adjacent strings ST in the second direction II-II' are coupled to each other to be one.

The semiconductor memory device further may include a first line 31 extending in the first direction I-I', and a second line 32 extending in the second direction II-II'. The first line 31 may be used as a source line connected to the first channel layers 25 and the second line 32 may be used as a bit line connected to the second channel layers 26. FIG. 2B illustrates a case in which source lines connected to the strings ST adjacent along the second direction II-II' are isolated to be different patterns each other. That is, the channel columns 1 each have their respective source lines. FIG. 2C illustrates a case in which the strings ST adjacent along the second direction II-II' share a source line. That is, adjacent pairs of the channel columns 1 have their respective source lines.

Figure 3A:
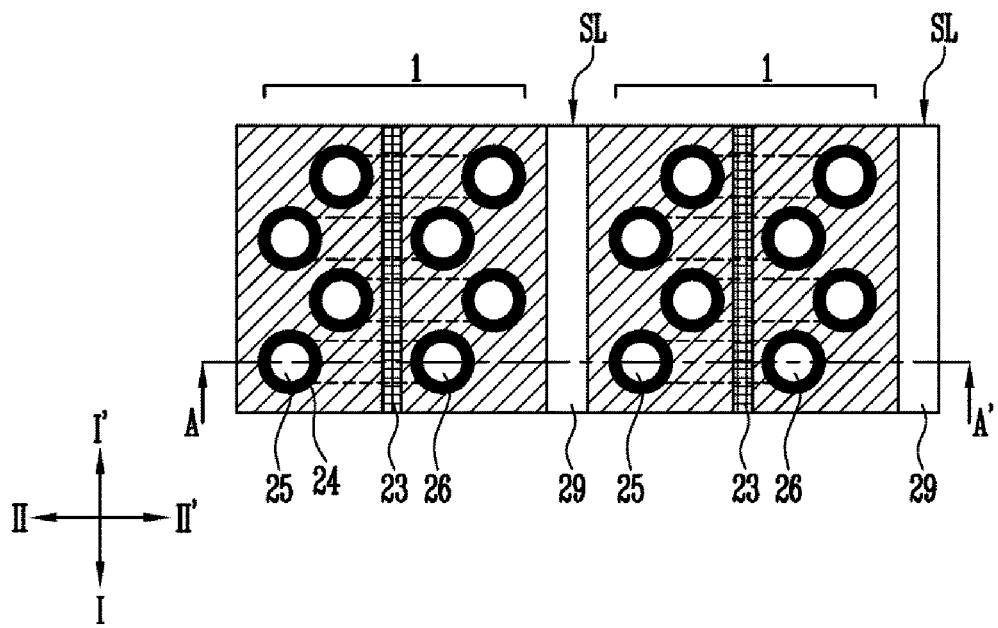
FIGS. 3A to 3C illustrate a structure of a semiconductor memory device according to an embodiment of the present invention.
Figure 3B:
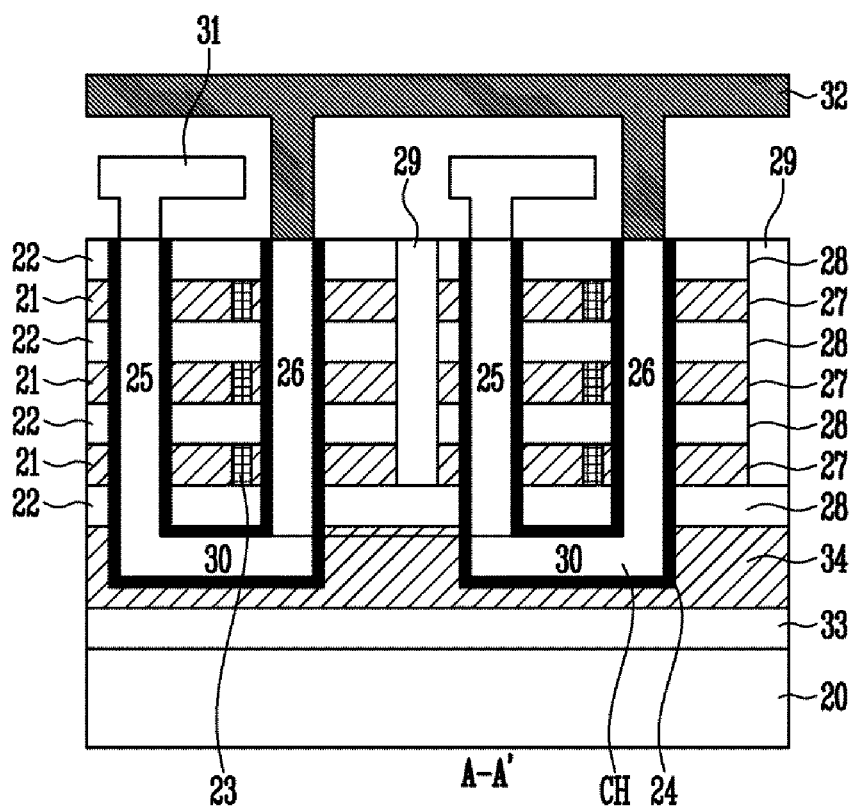
Figure 3C:
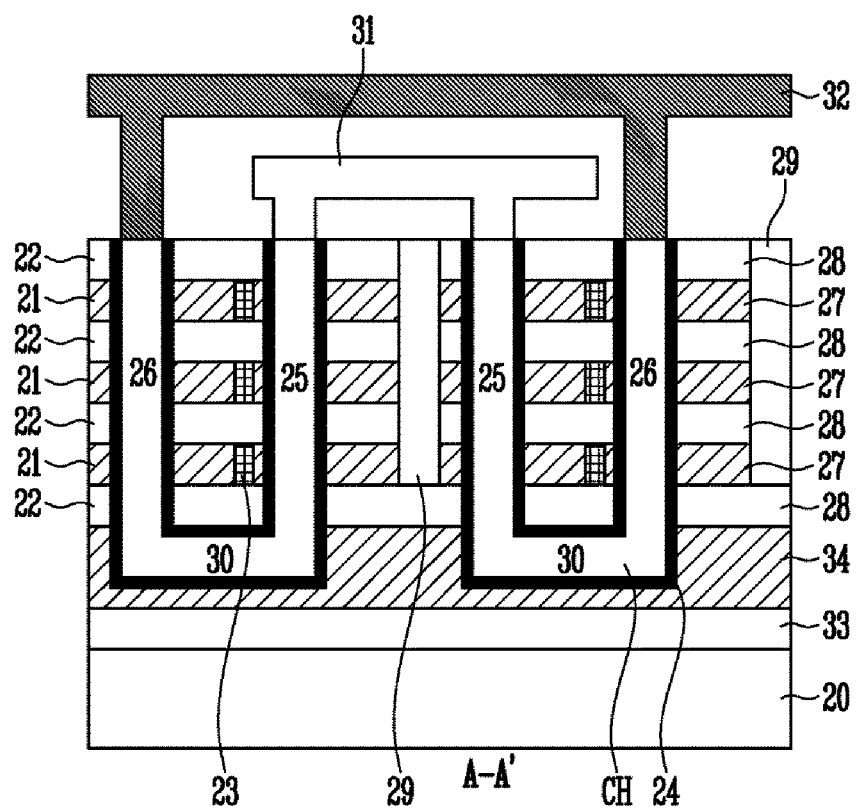

FIGS. 3A to 3C illustrate a structure of a semiconductor memory device according to an embodiment of the present invention. FIG. 3A is a top view of the semiconductor memory device, and FIGS. 3B and 3C are cross-sectional views taken along line A-A' of FIG. 3A. Hereinafter the structure of the semiconductor memory device will be described without duplicating the aforementioned.

As shown in FIGS. 3A to 3C, the semiconductor memory device according to an embodiment of the present invention may include a plurality of channel columns 1 extending in the first direction I-I', the first insulating layers 22 and the conductive layers 21 that are alternately stacked to surround the first channel layers 25, the second insulating layers 28 and the second conductive layers 27 that are alternately stacked to surround the second channel layers 26, the first line 31 extending in the first direction I-I', and the second line 32 extending in the second direction II-II'.

The semiconductor memory device further may include the spacers 23 between the first and second channel layers 25 and 26 adjacent along the second direction II-II', particularly between the first and second channel layers 25 and 26 connected through the third channel layer 30.

Additionally, the semiconductor memory device further may include slits SL placed between the first and second channel layers 25 and 26, particularly between the adjacent channel columns 1. According to this structure, the first conductive and insulating layers 21 and 22 of the strings ST adjacent along the second direction II-II' are isolated from the second conductive and insulating layers 27 and 28 through the slits SL. The spacers 23 also isolate the first conductive layers 21, which are coupled to one string ST, from the second conductive layer 27, and connect the first insulating layers 22, which are coupled to one string ST, with the second insulating layers 28.

FIGS. 4A to 8A and 4B to 8B illustrate a method of manufacturing a semiconductor memory device according to an embodiment of the present invention. FIGS. 4A to 8A are top views and FIGS. 4B to 8B are cross-sectional views taken along line A-A' of FIGS. 4A to 8A.

Figure 4A:
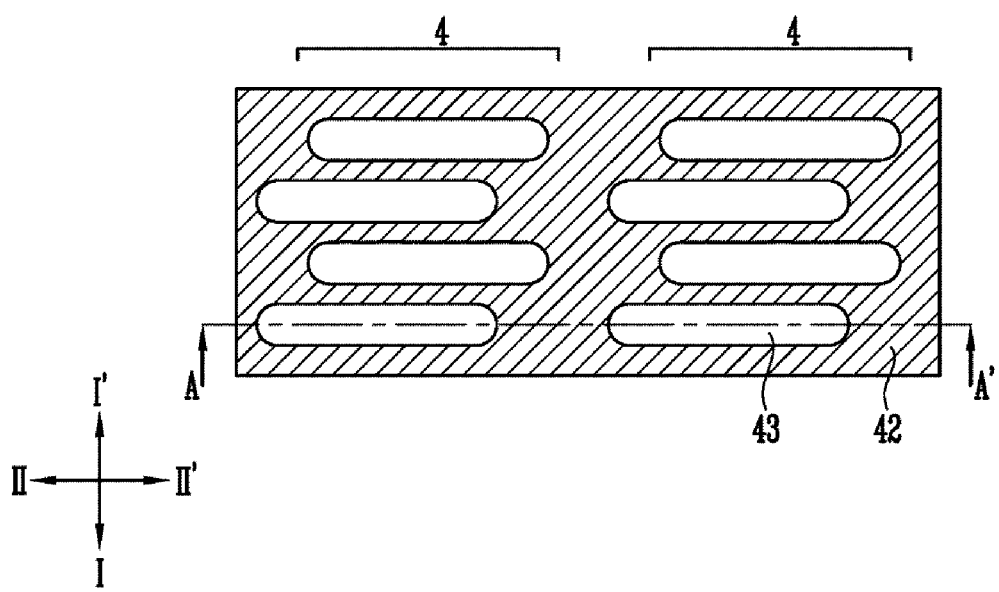
Figure 4B:
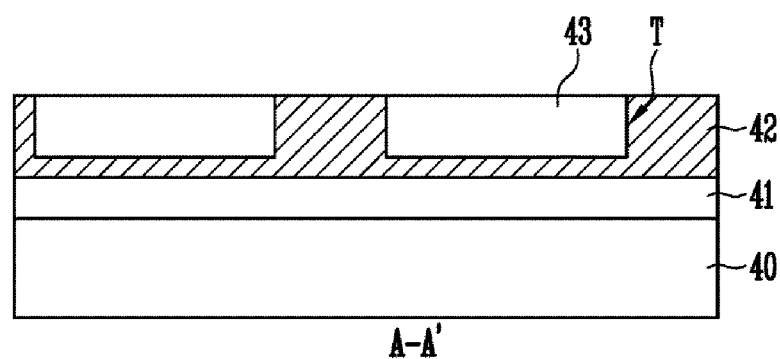

As shown in FIGS. 4A and 4B, after forming an insulating layer 41 on a substrate 40, a first conductive layer 42 is formed on the insulating layer 41. For instance, the first conductive layer 42 is provided to form a pipe gate, containing polysilicon.

Subsequently, a plurality of trenches T are formed in the first conductive layer 42. The plurality of trenches T are arranged in the first direction I-I' and the second direction II-II' intersecting the first direction I-I'. Here, the trenches arranged in the first direction I-I' constitute a trench column 4. The trenches T included in one trench column 4 may be arranged to be offset by their centers. Then, sacrificial layers 43 are formed in the trenches T. The sacrificial layers 43 may contain nitride, titanium, etc.

Figure 5A:
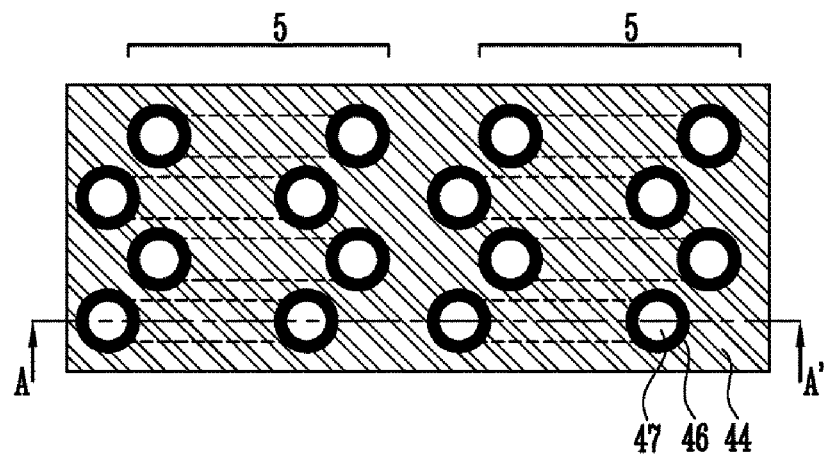
Figure 5B:
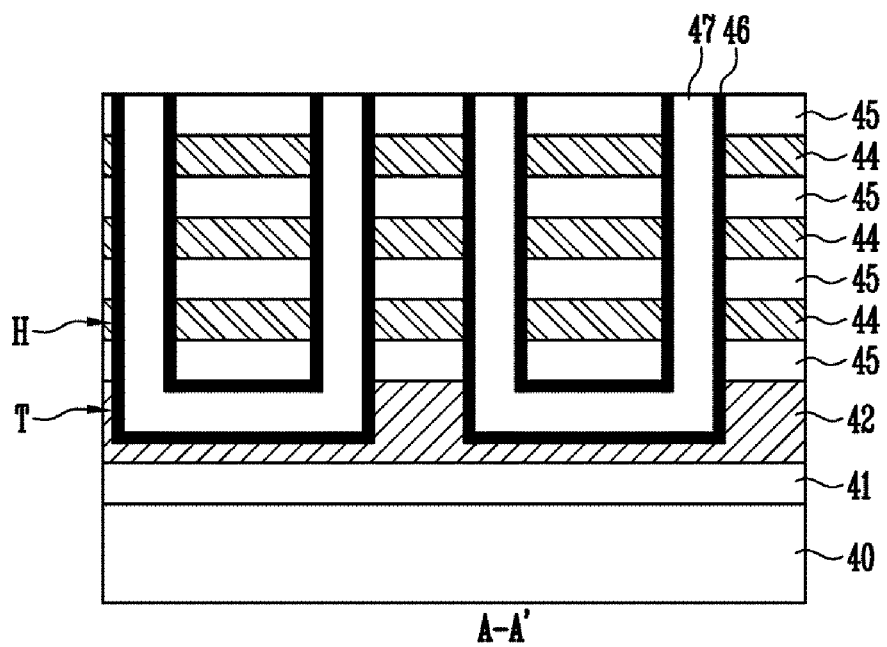

As shown in FIGS. 5A and 5B, on the first conductive layer 42 where the sacrificial layers 43 are formed, a plurality of first and second material layers 44 and 45 are alternately formed. The first material layers 44 are made of a material having larger etching selectivity than that of the second material layers 45. For example, the first material layers 44 may be formed to be a sacrificial layer containing nitride, while the second material layers 45 may be formed to be an insulating layer containing oxide. Alternatively, the first material layers 44 may be formed to be a sacrificial layer containing oxide, while the second material layers 45 may be formed to be an insulating layer containing nitride. Alternatively, the first material layers 44 may be formed to be a sacrificial layer containing titanium, while the second material layers 45 may be formed to be an insulating layer containing oxide.

Next, holes H are formed to penetrate the plurality of first and second material layers 44 and 45. The holes H may have various types of planes such as circle, ellipse, polygon, etc. One of the trenches T may be connected to at least two of the holes H.

Subsequently, the sacrificial layers 43 are removed through the holes H, connecting the trenches T with the holes H in one. Then, memory layers 46 are formed in the trenches T and the holes H. Each memory layer 46 may include at least one of a charge blocking layer, a data storage layer, and a tunnel insulating layer. The data storage layer may include a floating gate containing silicon, etc., a charge trap layer containing nitride, etc., nanodots, a phase changeable material layer, etc.

Subsequently, channel layers 47 are formed in the holes H where the memory layers have been settled. As a result, channel columns 5 are formed to extend in the first direction I-I'. If one trench T and two holes H are connected in a shape of U, each channel layer 47 may include a pipe channel layer formed in the trench T, and source/drain-side channel layers formed in the holes H. The channel layers 47 adjacent along the second direction II-II' may be arranged to make the source/drain-side channel layers be adjacent to each other, or make the source-side channel layers (or the drain-side channel layers) be adjacent to each other.

Figure 6A:
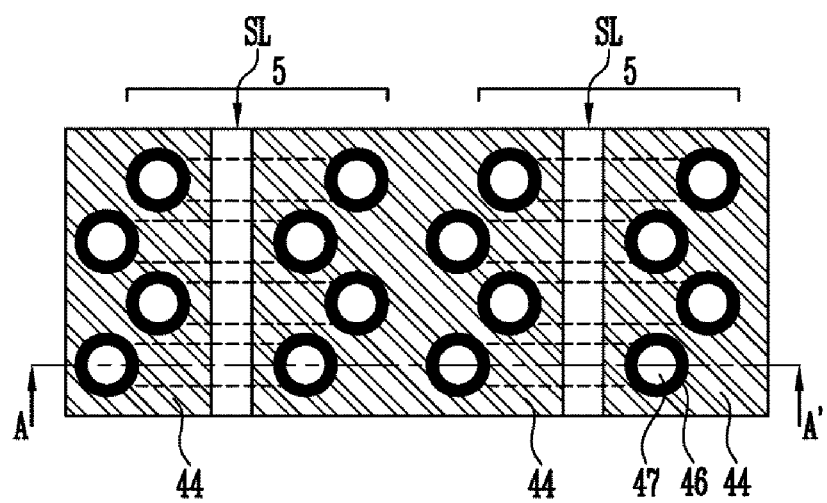
Figure 6B:
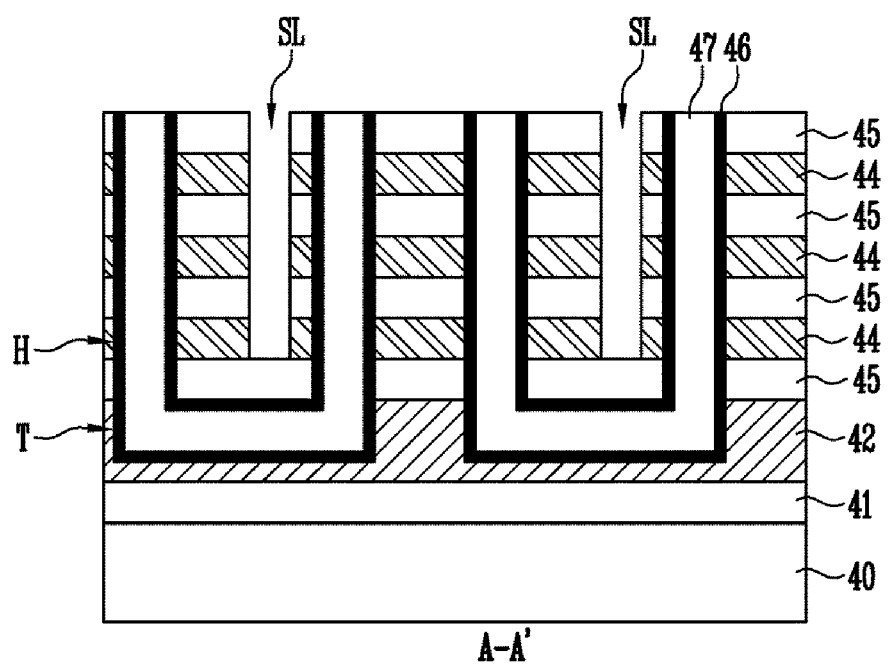

As shown in FIGS. 6A and 6B, the slits SL are formed to penetrate the first and second material layers 44 and 45. As a result, the stacked first and second material layers, 44 and 45, are patterned to turn into a plurality of stacks. Here, the slits SL are formed in a depth capable of wholly penetrating the first material layers 44, exposing the first material layers 44.

Additionally, the slits SL may be placed between the source/drain-side channel layers connected through one pipe channel layer, or between the adjacent channel columns 5. In an embodiment an example will be described where the slits SL are placed between the source/drain-side channel layers connected through one pipe channel layer. In these cases, the slits SL isolate the source sides from the drain sides in one string ST.

Figure 7A:
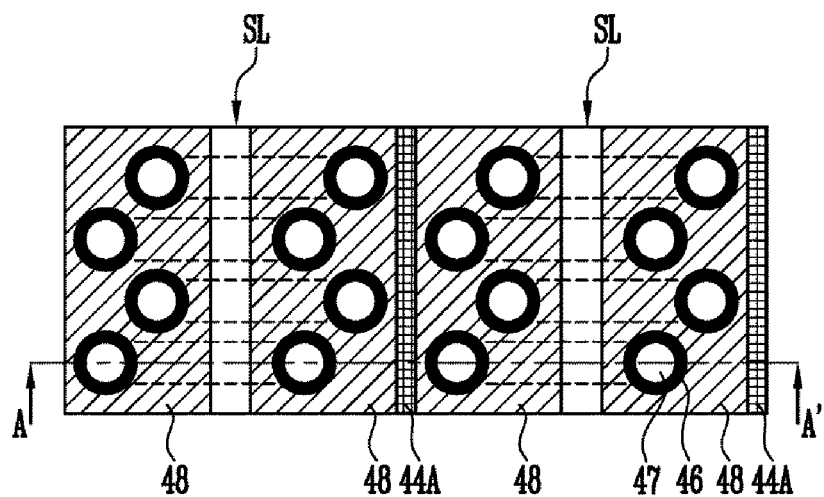
Figure 7B:
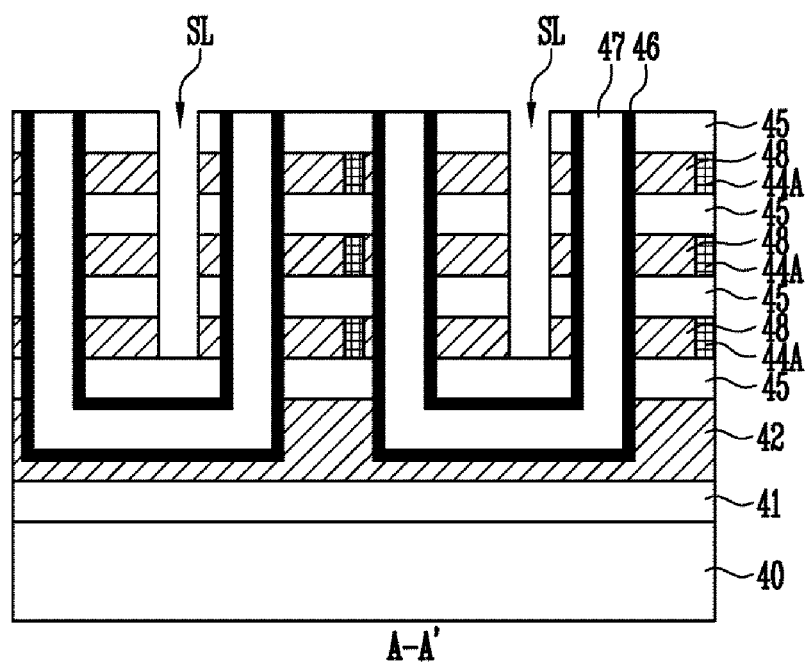

As shown in FIGS. 7A and 7B, the first material layers 44 are removed through the slits SL, forming a plurality of grooves. For example, a wet etching process is carried out to selectively etch the first material layers 44 to form a plurality of grooves. During this, the processing condition is adjusted to allow the first material layers 44 to partially remain in the stacks. According to such a process, since the first material layers 44 are etched away from both sidewalls of the stacks, the remnants of the first material layers 44 are formed in a shape of lines at the centers of the stacks. Hereinafter, the remnants of the first material layers 44 are referred to as spacers 44A.

The grooves are placed at both sidewalls of the stacks, centering on the spacers 44A. The spacer 44A isolates grooves of both sides from each other. Especially in these types of embodiments, the spacers 44A are placed between the adjacent channel columns 5.

Subsequently, second conductive layers 48 are formed in the plurality of grooves. The second conductive layers 48 may contain tungsten, tungsten nitride, titanium, titanium nitride, etc. In one of the stacks, the second conductive layers 48 formed in the left and right grooves are isolated from each other through the spacers 44A.

Although not shown in the drawings, it is possible to additionally form memory layers in the plurality of grooves before depositing the second conductive layers 48. Here, the memory layer may include at least one of a tunnel insulating layer, a data storage layer, and a charge blocking layer.

Figure 8A:
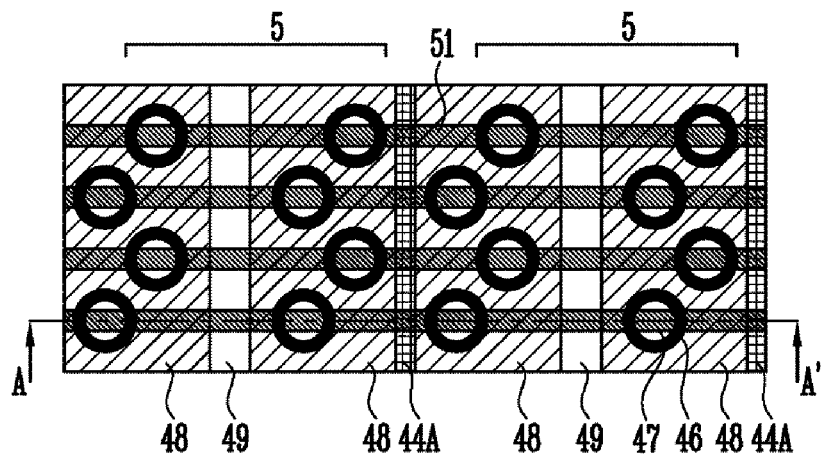
Figure 8B:
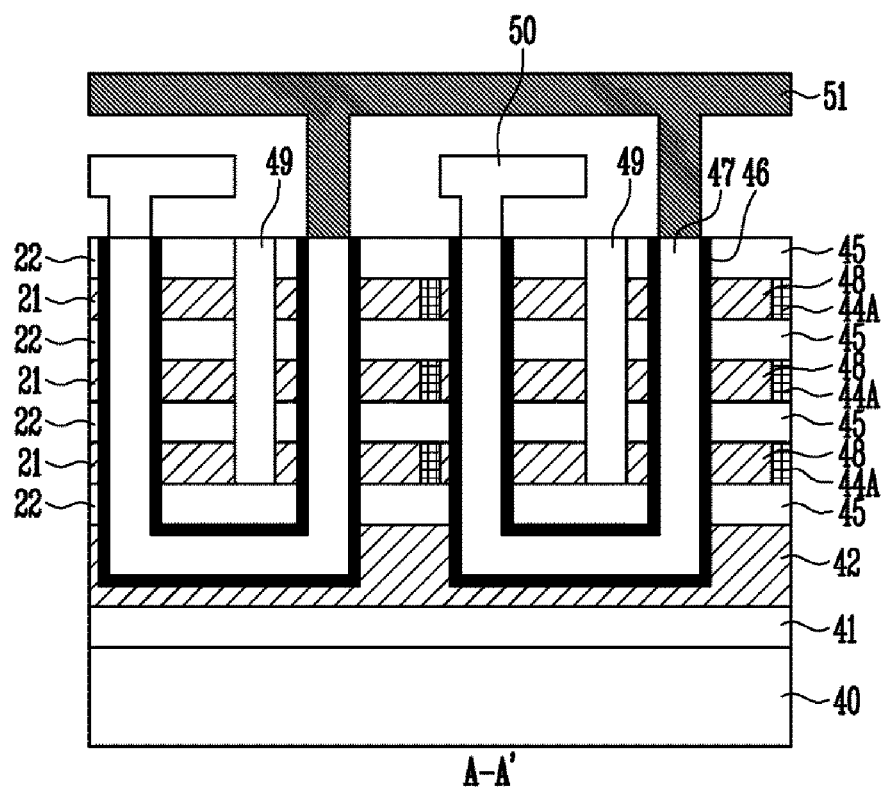

As shown in FIGS. 8A and 8B, an insulating layer 49 is formed in the slits SL. During this, the processing condition of deposition may be adjusted to form air gaps in the slits SL.

Subsequently, after forming an interlayer insulating layer (not shown), a first line 50 and a second line 51 are formed in the interlayer insulating layer. The first line 50 may be used as a source line extending in the first direction I-I', while the second line 51 may be used as a bit line extending the second direction II-II'. Additionally, the first line 50 may be connected to the source-side channel layer, while the second line 51 may be connected to the drain-side channel layer. Especially in these types of embodiments, as the channel layers are arranged to neighbor the source/drain-side channel layers of the channel layers 47 adjacent along the second direction II-II', the first lines 50 are formed for every channel columns 5. As a result, the semiconductor memory device described in conjunction with FIG. 2B is manufactured.

According to the aforementioned process, the spacers 44A may be formed by partially removing the first material layers 44. Accordingly, there is no need to additionally form slits for isolating the source and drain sides of the string ST, and thus it is possible to simplify the process. Furthermore, as only the conductive layers of the source and drain sides are isolated while the insulating layers are maintained to be connected with each other, it is possible to maintain a stabilized structure for the stacks during the manufacturing process. Moreover, as the number of the slits can be reduced, it is possible to further enhance the integration capacity.

From the aforementioned embodiments, the semiconductor memory device described with reference to FIGS. 1B, 2C, 3B, and 3C can be also manufactured. As an example, various structures of semiconductor memory devices may be manufactured in correspondence with patterns of connecting the first and second lines 50 and 51 and arranging the channel layers.

For the semiconductor memory device described in conjunction with FIG. 1B, without forming the insulating layer 41, first conductive layer 42 and sacrificial layers 35, the first and second material layers 44 and 45 are alternately formed on the substrate where the source regions have been settled. The other processing steps are carried out similar to the foregoing.

For the semiconductor memory device described in conjunction with FIG. 2C, the channel layers 47 are arranged to neighbor the source-side channel layers (or the drain-side channel layers) of the channel layers 47 adjacent along the second direction II-II'. And, the first line 50 is formed to be shared by the channel layers 47 adjacent along the second direction II-II'. The other processing steps are carried out similar to the foregoing.

For the semiconductor memory device described in conjunction with FIG. 3B, the slits SL are formed between the adjacent channel columns 5. In this structure, the spacers 44A remain between the source/drain-side channel layers that are connected through one pipe channel layer. The other processing steps are carried out similar to the foregoing.

For the semiconductor memory device described in conjunction with FIG. 3C, the slits SL are formed between the adjacent channel columns 5. In this structure, the spacers 44A remain between the source/drain-side channel layers that are connected through one pipe channel layer. The channel layers 47 are arranged to neighbor the source-side channel layers (or the drain-side channel layers) of the channel layers 47 adjacent along the second direction II-II', and the first line 50 is formed to be shared by the channel layers 47 adjacent along the second direction II-II'. The other processing steps are carried out similar to the foregoing.

Figure 9:
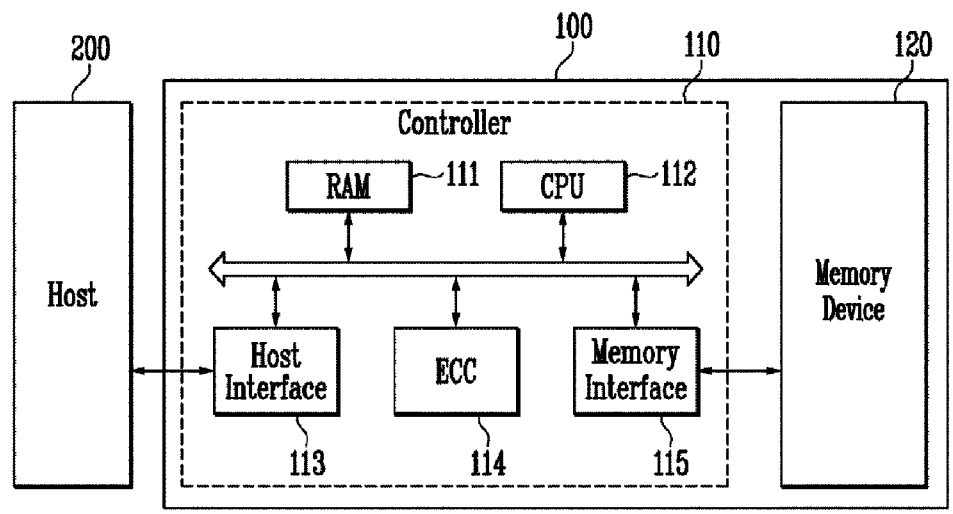
FIG. 9 is a block diagram illustrating a configuration of a memory system according to an embodiment of the present invention.

FIG. 9 is a block diagram illustrating a configuration of a memory system according to an embodiment of the present invention.

As shown in FIG. 9, the memory system 100 according to an embodiment may include a memory device 120 and a controller 110.

The memory device 120 is used for storing data information having various data forms such as texts, graphics, software codes, etc. The memory device 120 may be a nonvolatile memory, or the semiconductor memory device aforementioned with reference to FIGS. 1 to 8. The memory device 120 may include: a plurality of first channel columns having a plurality of first channel layers that are arranged in a direction and offset by their centers; a plurality of second channel columns alternately arranged with the plurality of first channel columns and having a plurality of second channel layers that are arranged in the direction and offset by their centers; the first insulating and conductive layers alternately stacked to surround the first channel layers; the second insulating and conductive layers stacked to surround the second channel layers; and the spacers placed between the first and second channel columns and interposed between the first and second conductive layers at the same level. The structure and manufacturing method of the memory device 120 is same as the foregoing, so will not be further detailed.

The controller 110 is connected to a host 200 and the memory device 120 and may be configured to access the memory device 120 in response to a request from the host 200. For example, the controller 110 may be configured to control operations of reading, writing, erasing, backgrounding, etc. for the memory device 120.

The controller 110 may include at least a part of a Random Access Memory (RAM) 111, a Central Processing Unit (CPU) 112, a host interface 113, an Error Correction Code (ECC) circuit 114, and a memory interface 115.

From the configuration, the RAM 111 is used as at least one of an operation memory of the processing unit, a cache memory between the semiconductor memory device 120 and the host 200, and a buffer memory between the memory device 120 and the host 200. As an example, the RAM 111 may be substituted with Static RAM (SRAM) or a Read Only Memory (ROM).

The CPU 112 may be configured to control general operations of the controller 110. For example, the CPU 112 may be configured to manage a firmware such as a Flash Translation Layer (FTL) that is stored in the RAM 111.

The controller 110 may be configured to provide an interface between the memory device 120 and the host 200. For example, the host interface 113 may be configured to interface with the host 200 and the memory interface 115 may be configured to interface with the memory device 120. The controller 110 may be configured to communicate with the host 200 through at least one of diverse interface protocols such as Universal Serial Bus (USB) protocol, MultiMedia Card (MMC) protocol, Peripheral Component Interconnection (PCI) protocol, PCI-express (PCI-E) protocol, Advanced Technology Attachment (ATA) protocol, Serial-ATA (SATA) protocol, Parallel-ATA (PATA) protocol, Small Computer Small Interface (SCSI) protocol, Enhanced Small Disk Interface (ESDI) protocol, Integrated Drive Electronics (IDE) protocol, private protocol, etc.

The ECC circuit 114 may be configured to detect and correct an error, which is included in data read from the memory device 120, by means of ECC. The memory interface 115 may be configured to perform an interface with the memory device 120. For example, the memory interface 115 may include a NAND or NOR interface.

The controller 110 may further include a buffer (not shown) for temporarily storing data. The buffer may be used for temporarily storing data, which are transferred to the outside via the host interface 113, or data transferred from the memory device 120 via the memory interface 115. The controller 110 may further include a ROM to store coded data for interfacing with the host 200.

The memory system 100 with this structure may be implemented as a memory card. For example, the memory card may be a personal computer card (PCMCIA; Personal Computer Memory Card International Association), a Compact Flash Card, a Smart Media card, a memory stick, a multimedia Card (e.g. MMC, RS-MMC, MMCmicro, etc.), an SD card (e.g. SD, miniSD, microSD, SDHC, etc.), a Universal Flash Storage (UFS), etc.

In this way, since the memory system 100 according to an embodiment of the present invention may include the memory device 120 that is stabilized in architecture, simplified in a manufacturing process, and improved in integration capacity, it is possible to raise an integration rate and a product yield of the memory system 100.

Figure 10:
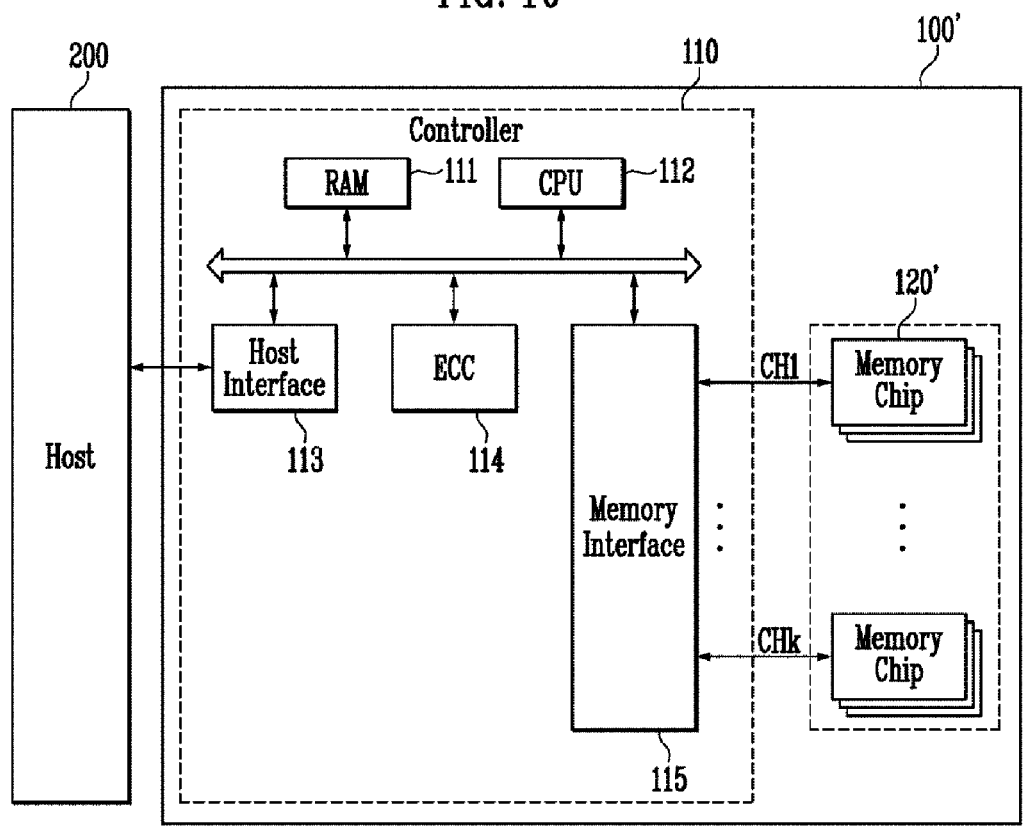
FIG. 10 is a block diagram illustrating a configuration of a memory system according to an embodiment of the present invention.

FIG. 10 is a block diagram illustrating a configuration of a memory system according to an embodiment of the present invention. Hereinafter will be described the memory system, without duplicating the foregoing.

As shown in FIG. 10, the memory system 100' according to an embodiment of the present invention may include a memory device 120' and the controller 110. The controller 110 may include at least a part of the RAM 111, the CPU 112, the host interface 113, the ECC circuit 114, and the memory interface 115.

The memory device 120' may be implemented as a nonvolatile memory, or the semiconductor memory device aforementioned in conjunction with FIGS. 1 to 8. The memory device 120' may include: a plurality of first channel columns having a plurality of first channel layers that are arranged in a direction and offset by their centers; a plurality of second channel columns alternately arranged with the plurality of first channel columns and having a plurality of second channel layers that are arranged in the direction and offset by their centers; the first insulating and conductive layers alternately stacked to surround the first channel layers; the second insulating and conductive layers stacked to surround the second channel layers; and the spacers placed between the first and second channel columns and interposed between the first and second conductive layers at the same level. The structure and manufacturing method of the memory device 120' is same as the foregoing, so will not be further detailed.

The memory device 120' may be implemented as a multi-chip package composed of a plurality of memory chips. The plurality of memory chips are divided into a plurality of groups that may be configured to independently communicate with the controller 110 via first to kth channels CH1~CHk. The memory chips included in one of the groups may be configured to communicate with the controller 110 via their common channel. For example, it is also possible to transform the memory system 100' to connect one memory chip with one channel.

The memory system 100' with this configuration may be implemented as a subsidiary storage unit, a storage server, etc. For example, the subsidiary storage unit may be implemented as a Solid State Drive (SSD), etc. and the storage server may be implemented as a mail server.

In this way, since the memory system 100' according to an embodiment of the present invention may include the memory device 120' that is stabilized in architecture, simplified in a manufacturing process, and improved in integration capacity, it is possible to raise an integration rate and a product yield of the memory system 100'. Especially, by forming a multi-chip package with the memory device 120', it is possible to increase the capacity of the memory system 100'.

Figure 11:
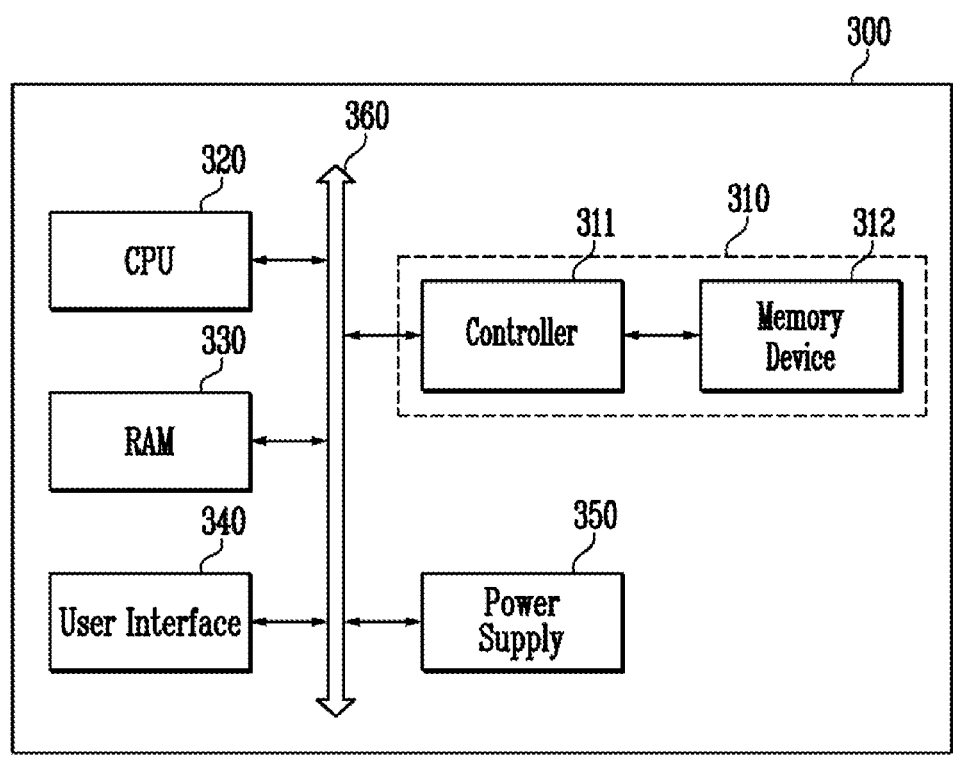
FIG. 11 is a block diagram illustrating a configuration of a computing system according to an embodiment of the present invention.

FIG. 11 is a block diagram illustrating a configuration of a computing system according to an embodiment of the present invention. Hereinafter will be described the memory system, without duplicating the foregoing.

As shown in FIG. 11, the computing system 300 according to an embodiment of the present invention may include at least a part of a memory system 310, a CPU 320, a RAM 330, a user interface 340, a power supply 350, and a system bus 360.

The memory system 310 may include a controller 311 and a memory device 312. The memory device 312 may be implemented as a nonvolatile memory, or the semiconductor memory device aforementioned in conjunction with FIGS. 1 to 8. The memory device 312 may include: a plurality of first channel columns having a plurality of first channel layers that are arranged in a direction and offset by their centers; a plurality of second channel columns alternately arranged with the plurality of first channel columns and having a plurality of second channel layers that are arranged in the direction and offset by their centers; the first insulating and conductive layers alternately stacked to surround the first channel layers; the second insulating and conductive layers stacked to surround the second channel layers; and the spacers placed between the first and second channel columns and interposed between the first and second conductive layers at the same level. The structure and manufacturing method of the memory device 312 is same as the foregoing, so will not be further detailed.

The memory system 310 is electrically connected to the CPU 320, the RAM 330, the user interface 340, and the power supply 350 via the system bus 360. The memory system 310 stores data provided through the user interface 340, or data processed by the CPU 320.

Exemplarily, the memory system 310, as stated in conjunction with FIG. 10, may be implemented as a multi-chip package composed of a plurality of memory chips. The memory device 312 may be connected to the system bus 360 directly or via the controller 311. If the memory device 312 is directly connected to the system bus 360, the functions of the controller 311 may be performed by the CPU 320 and the RAM 330.

The computing system 300 with this structure may be implemented as a Ultra Mobile PC (UMPC), a net book, a Personal Digital Assistant (PDA), a portable computer, a web tablet, a wireless phone, a mobile phone, a smartphone, an e-book, a Portable Multimedia Player (PMP), a portable gaming machine, a navigation device, a black box, a digital camera, a 3-dimensional television, a digital audio recorder, a digital audio player, a digital picture recorder, a digital picture player, a digital video recorder, a digital video player, a device for transmitting/receiving information in a wireless environment, one of diverse electronic devices composing a home network, one of diverse electronic devices composing a computer network, one of diverse electronic devices composing a telematics network, an RFID device, etc.

For example, if the computing system 300 is a mobile apparatus, the power supply 350 may be implemented in a battery, further including an application chipset, a camera image processor (e.g. CIS; CMOS image sensor), a mobile DRAM, a communication module, etc.

In this way, since the computing system 300 according to an embodiment of the present invention may include the memory device 312 that is stabilized in architecture, simplified in a manufacturing process, and improved in integration capacity, it is possible to raise an integration rate and a product yield of the computing system 300.

As can be seen from the foregoing, it is possible to stabilize the stacked structure and simplify the manufacturing process. Moreover, it is possible to enhance the integration capacity.

In the drawings and specification, there have been disclosed typical examples of embodiments of the invention and, although specific terms are employed, they are used in a generic and descriptive sense only and not for purposes of limitation. As for the scope of the invention, it is to be set forth in the following claims. Therefore, it will be understood, by those ordinarily skilled in the art that various changes in form and details may be made therein without departing from the spirit and scope of the present invention as defined by the following claims.

What is claimed is:

1. A semiconductor memory device comprising:
   a plurality of first channel columns including a plurality of first channel layers that are arranged in a direction and offset by their centers;
   a plurality of second channel columns alternately arranged with the plurality of first channel columns and having a plurality of second channel layers that are arranged in the direction and offset by their centers;
   first insulating layers and first conductive layers alternately stacked to surround the first channel layers;
   second insulating layers and second conductive layers alternately stacked to surround the second channel layers; and
   spacers placed between the first channel columns and the second channel columns and interposed between the first conductive layers and the second conductive layers,
   wherein the first conductive layers, the second conductive layers and the spacers extend in a same direction.

2. The semiconductor memory device of claim 1, wherein, the spacers are interposed between the first conductive layers and the second conductive layers at the same level.

3. The semiconductor memory device of claim 1, further comprising slits placed between the first channel columns and second channel columns and configured to isolate the first insulating layers and the first conductive layers from the second insulating layers and the second conductive layers.

4. The semiconductor memory device of claim 3, wherein the spacers and the slits are alternately placed between the first channel columns and the second channel columns.

5. The semiconductor memory device of claim 1, wherein each of the spacers is inclined to be closer to the first channel layer or the second channel layer.

6. The semiconductor memory device of claim 1, wherein each of the spacers includes at least one of oxide, nitride, or titanium.

7. A semiconductor memory device comprising:
   a plurality of channel columns including a plurality of channel layers that are arranged in a first direction and offset by their centers, wherein each of the channel layers includes a first channel layer, a second channel layer and a third channel layer connecting the first channel layer with the second channel layer;

first insulating layers and first conductive layers stacked to surround the first channel layers;
second insulating layers and second conductive layers stacked to surround the second channel layers; and
spacers placed between the first channel layers and the second channel layers adjacent to each other and interposed between the first conductive layers and the second conductive layers at the same level.

8. The semiconductor memory device of claim 7, further comprising slits placed between the adjacent first channel layers and second channel layers and configured to isolate the first insulating layers and the first conductive layers from the second insulating layers and the second conductive layers.

9. The semiconductor memory device of claim 8, wherein the spacers are placed between the first and second channel layers included in one of the channel columns, and
the slits are placed between the channel columns adjacent to each other.

10. The semiconductor memory device of claim 8, wherein the spacers are placed between the channel columns adjacent to each other, and
the slits are placed between the first and second channel layers included in one of the channel columns.

11. The semiconductor memory device of claim 7, wherein each of the spacers is inclined to be closer to the first channel layer or the second channel layer.

12. The semiconductor memory device of claim 7, wherein the first channel layer is a source-side channel layer, the second channel layer is a drain-side channel layer, and the third channel layer is a pipe channel layer.

13. The semiconductor memory device of claim 7, wherein the channel columns are arranged in a manner that the first channel layers and the second channel layers are alternately arranged.

14. The semiconductor memory device of claim 13, further comprising:
first lines connected to the first channel layers of the channel columns and configured to extend in the first direction; and
second lines connected to the second channel layers, which are arranged in a second direction intersecting the first direction, and configured to extend in the second direction.

15. The semiconductor memory device of claim 7, wherein the channel columns are arranged in a manner that the first channel layers are neighbored to each other and the second channel layers are neighbored to each other.

16. The semiconductor memory device of claim 15, further comprising:
first lines commonly connected to the first channel layers of the channel columns adjacent to each other and configured to extend in the first direction; and
second lines connected to the second channel layers, which are arranged in the second direction intersecting the first direction, and configured to extend in the second direction.

17. A semiconductor memory device comprising:
a plurality of first channel columns including a plurality of first channel layers arranged in a direction;
a plurality of second channel columns alternately arranged with the plurality of first channel columns and including a plurality of second channel layers arranged in the direction;
first conductive layers stacked to surround the first channel layers;
second conductive layers stacked to surround the second channel layers;
insulating layers interposed between the first conductive layers and between the second conductive layers and configured to surround the first and second channel layers; and
spacers placed between the first channel columns and the second channel columns, interposed between the first conductive layers and the second conductive layers and sandwiched between the insulating layers disposed at different levels.

18. The semiconductor memory device of claim 17, wherein the spacers are interposed between the first conductive layers and the second conductive layers at the same level.

19. The semiconductor memory device of claim 17, further comprising slits placed between the first channel columns and the second channel columns to penetrate the insulating layers and configured to isolate the first conductive layers from the second conductive layers.

20. The semiconductor memory device of claim 19, wherein the spacers and the slits are alternately placed between the first channel columns and the second channel columns.

21. The semiconductor memory device of claim 17, further comprising third channel layers connecting the first channel layers with the second channel layers.

22. The semiconductor memory device of claim 17, wherein each of the spacers are inclined to be closer to the first channel layer or the second channel layer.

* * * * *